United States Patent
Germann et al.

(10) Patent No.: US 6,754,615 B1
(45) Date of Patent: Jun. 22, 2004

(54) METHOD OF SIMULATING THE PERFORMANCE OF A VEHICLE ON A ROAD SURFACE

(75) Inventors: Stefan Germann, Lorsch (DE); Harald Nonn, Weinheim (DE); Wolfgang Kopecky, Lampertheim-Hüttenfeld (DE); Georg Abler, Graz (AT); Lothar Witte, Vaihingen (DE); Hai Tran Xuan, Korntal-Münchingen (DE); Michael Pfeiffer, Pforzheim (DE); Peter Brodbeck, Niefern-Öschelbronn (DE)

(73) Assignees: AVL Deutschland GmbH, Mainz-Kastel (DE); Dr. Ing.h.c.F. Porsche Aktiengesellschaft, Stuttgart (DE)

( * ) Notice: Subject to any disclaimer, the term of this patent is extended or adjusted under 35 U.S.C. 154(b) by 0 days.

(21) Appl. No.: 09/522,223

(22) Filed: Mar. 9, 2000

(30) Foreign Application Priority Data

Mar. 12, 1999 (DE) .................................. 199 10 967

(51) Int. Cl.[7] .............................................. G06G 7/48
(52) U.S. Cl. .................... 703/8; 703/1; 703/2; 702/140; 701/36; 73/146
(58) Field of Search .................... 703/2, 7, 1; 702/140; 701/36; 73/146

(56) References Cited

U.S. PATENT DOCUMENTS

| | | | |
|---|---|---|---|
| 4,872,116 A | 10/1989 | Ito et al. ................ | 364/424.05 |
| 4,939,985 A | 7/1990 | Von Thun .................. | 73/118.1 |
| 5,371,677 A | 12/1994 | Ehret et al. ............ | 364/426.02 |
| 5,557,520 A | 9/1996 | Suissa et al. .......... | 364/424.01 |
| 6,083,268 A * | 7/2000 | Kelsey et al. ................. | 703/7 |
| 6,199,026 B1 * | 3/2001 | Shiraishi et al. ............ | 702/140 |

FOREIGN PATENT DOCUMENTS

| | | | |
|---|---|---|---|
| DE | 3700409 A1 | 7/1987 | .......... B60R/16/02 |
| DE | 3818661 A1 | 12/1988 | .......... G01M/17/00 |
| DE | 4030653 A1 | 4/1992 | ............ G01B/1/00 |
| DE | 4325413 C2 | 2/1995 | .......... G01M/17/00 |
| EP | 338373 B1 | 10/1992 | .......... G01M/17/00 |
| EP | 0 775 902 | 5/1997 | |

OTHER PUBLICATIONS

Anonymous, "Tire Model Make Dynamic Studies More Real," Machine Design, vol. 71, No. 3, p. 154 (Feb. 11, 1999).*
Ray, "Experimental Determination of Tire Forces and Road Friction," IEEE Proceedings of the 1998 American Control Conference, vol. 3, pp. 1843–1847 (Jun. 1998).*
Zegelaar, P.W.A. et al., "Tyre Models for the Study of In–Plane Dynamics" Swets and Zeitlinger. Lisse, NL, Bd. 23, Aug. 23, 1993, pp. 578–590, XP000605838, ISSN: 0042–3114.

* cited by examiner

Primary Examiner—Samuel Broda
(74) Attorney, Agent, or Firm—Quarles & Brady LLP

(57) ABSTRACT

Method of simulating the performance of a vehicle on a roadway on a power train test bed with the help of torque-controlled electric load machines mounted on the shafts of the power train of the vehicle and with the help of a computer with a vehicle model stored therein and a tire model simulating the slip-dependent friction, in which method the angular wheel speed is measured on at least one of the shafts, and the tire model determines a force transmitted from the tire to the roadway at this angular wheel speed on the basis of the tire model using a vehicle velocity and a tire normal force, and it also determines a setpoint torque for this force for the torque-controlled load machine mounted on this shaft, in such a way that a difference corresponding to the actual slip is established between the measured angular wheel speed and a nominal angular wheel speed value corresponding to the vehicle velocity used in the tire model and calculated in the vehicle model with feedback of the force transferred to the road surface.

12 Claims, 3 Drawing Sheets

METHOD OF SIMULATING THE PERFORMANCE OF A VEHICLE ON A ROAD SURFACE

Figure 1:
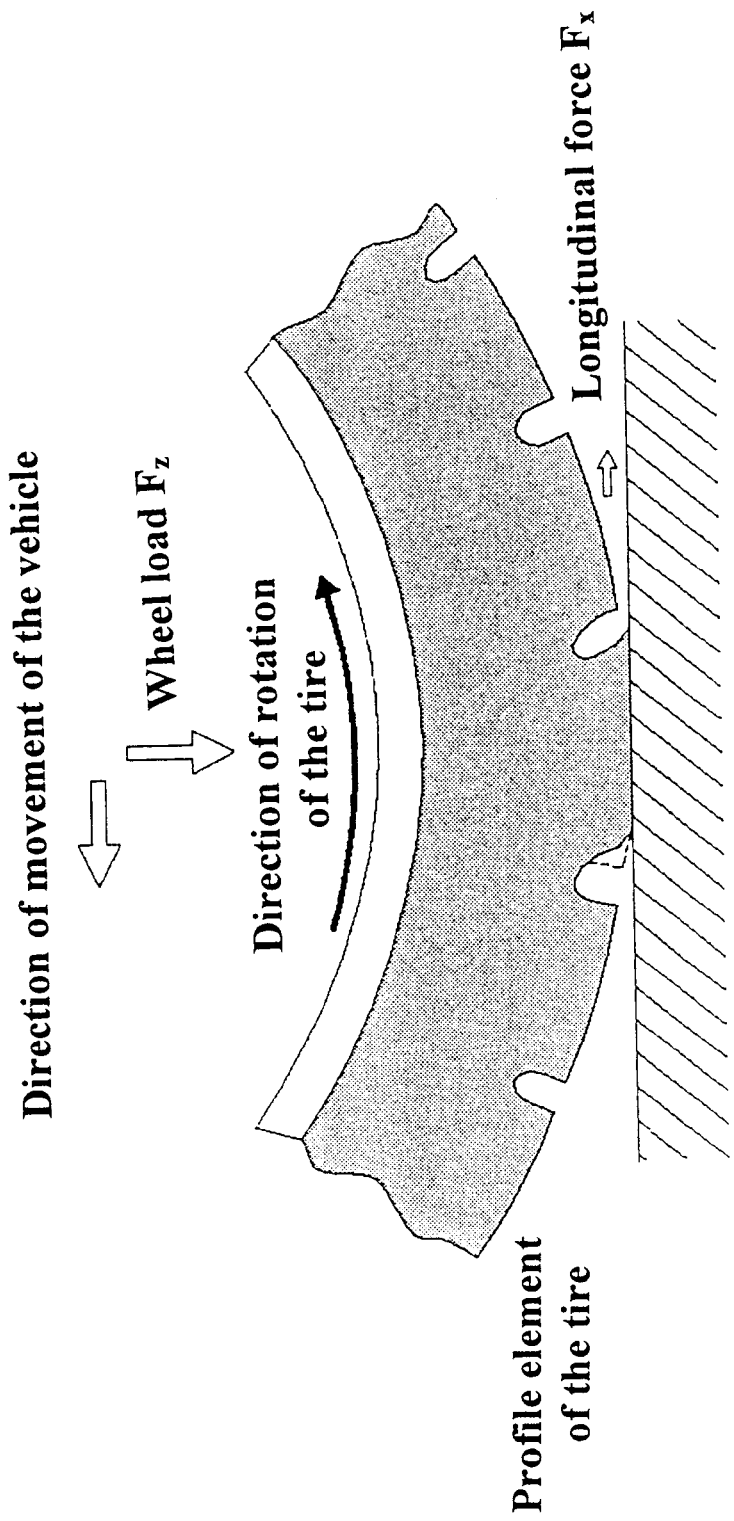

The present invention concerns a method of simulating the performance or behavior of a vehicle on a road surface on a power train or drive train test bed.

In addition to the simulation method described below on a power train test bed, German Patent No. 43 25 413 C2 and German Patent Application No. 40 30 653 A1 describe mathematical methods for estimating variables that characterize the actual driving performance but cannot be measured directly. To perform the estimation, the sensor signals that are accessible to measurement are processed with motion equations and take into account a tire model in such a way as to yield the desired variables. To arrive at a set of equations that can be solved to yield the desired variables, German Patent No. 43 25 413 C2, for example, treats the tire forces and the adhesion coefficient between a vehicle wheel and the roadway as quasi-steady-state variables. Signals representing the longitudinal velocity of the vehicle, the longitudinal and lateral acceleration, the yaw rate, the steering angle of the wheels and the angular wheel speed (so called wheel rpm) are entered as measured sensor signals into a computer unit. To make it possible to determine variables characterizing the vehicle attitude or handling in all vehicle driving conditions, the motion equations are supplemented according to German Patent No. 43 25 413 C2 by measurement equations that are based on a vehicle model and can be combined with the motion equations in such a way that the required set of equations for the side slip angle of the vehicle, for example, can be obtained. The measurement equations are derived from a four-wheel model. The side slip angle of the road surface with respect to a plane is used as a state variable. German Patent Application No. 40 30 653 A1 describes an estimation method for the side slip angle of the wheels or the axles of a braked vehicle and for the cornering forces on the wheels and the tire contact or normal forces. A simplified vehicle model which does not take pitching, rolling and up-and-down motion into account is assumed. Cornering force and braking force are calculated from the HSRI (Highway Safety Research Institute of the University of Michigan) tire model using the wheel speed, the yaw rate, the main brake cylinder pressure and the wheel brake pressures as measured quantities.

German Patent Application No. 37 00 409 A1 describes a motion estimation system which represents a simulated vehicle with a set of vehicle motion equations. The system uses a sensor for the measured vehicle velocity which is sent directly to a computer and a sensor for the steering angle which is used in a steering model. The computer should estimate the side slip angle among other variables and it also supplies a lateral acceleration value for use in a roll model. The roll model determines therefrom a vehicle roll angle which is in turn sent to the computer. The digital computer is connected to analog computation circuits for the steering model and the roll model, serving to simulate these parts of the total model used and supply the front wheel steering angle and the roll angle to the digital computer for the computer estimations. Then the digital computer calculates the desired vehicle motion variables from a planar motion model with the help of the measured vehicle velocity. This does not make it possible to implement a slip simulation.

Furthermore, for many years the automotive industry has been using test beds or stands to test the power train or drive train of a vehicle by simulating the running resistance and the acceleration performance of the vehicle and the vehicle wheels by using electric load machines mounted on the drive shafts of the vehicle. One such test bed is described in European Patent No. 338,373 B1, where the actual performance of the main power train, the axle gears, the driving shafts, the clutch, the transmission and the combustion engine enter into the calculations as existing components. The load machines are torque-controlled electric motors with a predetermined torque setpoint value provided by a computer. This value is generated from an angular wheel speed difference which is sent to an integrator with a time constant that is proportional to the tire damping or spring stiffness of the tire and a parallel proportional element with a gain factor that is proportional to the tire damping or elasticity constant. The torque setpoint is obtained from the sum of the elasticity moment and the damping moment supplied by the integrator and the proportional element. The angular speed difference is obtained from the measured angular velocity and the angular wheel speed of the drive shaft at the electric load machine and from an angular velocity that is proportional to the vehicle velocity. The latter is determined by integrating the running resistance moment, reduced by the torque setpoint values for the simulated wheels, in an integrator with a time constant that is proportional to the moment of inertia of the vehicle.

The method described above for obtaining the torque is thus based on a rotational speed regulation which takes into account the elasticity and damping of the tire but essentially disregards the tire slip. To overcome this inadequacy, it is known from European Patent No. 338,373 B1 that in order to take into account a kinematic tire slip, the product of the angular velocity and a slip value which is determined as a function of the torque setpoint, is subtracted from this angular velocity which is proportional to the vehicle velocity before the above angular wheel speed comparison is made on the basis of the angular velocity thus modified. With regard to this method of taking into account the kinematic slip, it has found to be a disadvantage that the moment distribution in the drive train during slip would have to be known to be able to utilize the expected moment balance to calculate the angular wheel speed gradient (rpm gradient), but precisely this moment distribution is not known in particular during dynamic processes or in systems with a variable moment or torque distribution (spinning). Therefore, a spinning or blocked wheel is simulated as an alternative so that the torque setpoint is limited to a corresponding constant slip moment which is calculated from a preselected adhesion value representing the road surface, a tire normal force and a tire radius. The tire is simulated in a slip-free model except torque transmitting conditions where the limiter causes the rotational speed regulator to run to its limit to simulate a locking or spinning wheel.

This known method of taking tire slip into account merely represents a compromise with regard to the realistic simulation of the tire, so that as a rule, a tire simulation is not implemented in today's power train test beds, and the only variables of vehicle performance that are tested are those where the tire and tire slip, respectively, can be disregarded. To avoid inadmissible torque curve values, a torque distribution corresponding only to the theoretical values of the power train but not to the actual curve values is presupposed on the test bed with the help of torque balancing regulators.

Otherwise, the test beds are used to reproduce load collectives whose data in the form of angular wheel speed and torque or moment on the wheels of interest are recorded in a conventional way on vehicles equipped with devices for measuring torque and rotational speed on a representative test route. Then the test object can be tested, for example, with regard to its endurance on the test bed, which is operated as a load test bed, by running the load collectives which have been obtained under realistic conditions on the test route. In the testing equipment described in German Patent Application No. 38 18 661 A1, the previously measured or calculated load collectives are also reproduced on a vehicle test bed. This document does not specify which programs are used in the computer of the testing equipment to specify the desired load collectives and determine the control outputs for the control elements. According to this document, a vehicle wheel is simulated by means of a simulation drive, control elements and computer without taking into account any up-to-date measured values generated during the simulation. By generating lateral forces and torques, respectively, at the control elements, normal forces and lateral forces are simulated, but the simulation is ultimately based on the predetermined load collectives.

The object of the present invention is to provide a method that will make it possible to simulate the performance or behavior of a vehicle on a roadway on a power train or drive train test bed with electric load machines (so called dynamometers) that simulate the wheels as realistically as possible.

This object is achieved by the subject of claim 1. Advantageous refinements are defined in the subclaims. According to the present invention, a vehicle speed is determined in a vehicle model with feedback of the force that is calculated in a tire model and is transmitted to the roadway, and the determined vehicle speed is in turn supplied to the tire model to achieve the slip simulation defined in claim 1. The force transmitted to the roadway and a setpoint torque which results for this force for the corresponding torque-controlled load machine are determined in turn for a measured angular wheel speed from the vehicle velocity and a tire normal force in the tire model in such a way that a difference corresponding to the actual slip between the measured angular wheel speed and a nominal angular wheel speed value corresponding to the vehicle velocity automatically builds up or establishes in the feedback system.

In contrast with the state of the art (European Patent No. 338,373 B1) described above, the method according to the present invention avoids rotational speed control to obtain a torque setpoint for the electric load machine. Instead, the torque setpoint is determined with the help of a tire model simulating the slip-dependent friction of a tire. In particular, in the method of the present invention, the tire model is used to determine a force from the angular wheel speed measured on the drive shaft or on the electric machine, which force corresponds to the force being transmitted from the tire to a road surface at this angular wheel speed, taking into account a permanent slip occurring in the actual case. To do so, a respective tire normal force and a vehicle velocity are entered into the tire model as additional input quantities.

In contrast to the known rotational speed control explained above, in the present invention a true deviation or difference between the measured angular wheel speed and a nominal angular wheel speed which is proportional to the vehicle velocity is automatically established in the feedback system using the tire model. Said true deviation corresponds to that under actual driving conditions. This makes it possible to simulate actual driving conditions. Furthermore, this method takes into account the contact properties of the tire, including the varying amount of the tire contact surface on the road surface as well as the respective driving situation (driving straight ahead, cornering, different roadway surface inclinations and the resulting variable wheel normal forces).

The parameters entering into the tire model can be used in the equations of the respective model to simulate in particular the slip dependence of the coefficient of friction for the respective parameters. The curves of the coefficient of friction as a function of slip are in principle similar to the model according to Pacejka, Böhm or HSRI in the different known tire models, including a steep slope starting from a slip of zero up to a maximum coefficient of friction at a critical slip with the subsequent comparatively moderate drop in coefficient of friction until the slip assumes a value of one.

The method according to the present invention is not limited to a specific tire model. However, the tire model must take into account the above discussed principal curve of the coefficient of friction as a function of slip and it must take into account a slip that is established in the actual case with an accuracy that meets the respective requirements. Using the tire normal or contact force, it is then possible to determine the force applied by the tire to the roadway surface under certain conditions and to determine a corresponding setpoint for the torque of the electric machine simulating the tire and thus it is possible to simulate the tire in a realistic manner. Then, the permanent deviation between the nominal and actual angular wheel speeds occurring under these conditions, i.e., a permanent slip, is established automatically for each angular wheel speed value or rpm value in the control circuit automatically controlling the torque of the electric load machine.

A summary of examples of formalisms for taking the tire-roadway surface into account can be found in St. German (1997) "Modellbildung und Modellgestützte Regelung der Fahrzeuglängsdynamik" [Modeling and model-based control of the longitudinal dynamics of a vehicle], VDI Bericht [Report of the German Society of Engineers] 12/309, page 34 and following pages and page 55 and following pages. The sources for various empirical and theoretical tire models are also listed and various model theories are compared. In addition, there are examples of equations for taking into account the longitudinal, lateral and vertical motions of a vehicle. Using Pacejka's model, the values of specific parameters of this model are estimated and compared with parameters determined theoretically according to the model. However, Pacejka's tire model is just one possible model that can be used in the method according to the present invention. Those skilled in the art can also modify the tire model they prefer and optionally simplify it so that it includes only those parameters that are also to be taken into account in the simulation. Furthermore, reference is made to the article by M. Würtenberger (1997) "Modellgestützte Verfahren zur Überwachung des Fahrzustands eines PKW" [Model-based methods of supervision of driving conditions of a passenger vehicle], VDI Bericht 12/314, especially pages 30 through 41 and pages 156 through 158. Here again, reference is made to Pacejka's model.

Another advantage of the method of generating the torque setpoint according to the present invention from a tire model that takes slip into account consists of the fact that the delay in the change in torque can be simulated by the tire model in accordance with the shift of latch, the variable portion of the tire contact surface on the road.

The dynamic tire radius established in each case can also be taken into account here by the flattening of the contact surface of the tire. The force determined according to the present invention, which is transmitted from the tire to the road surface in the actual case, is entered into a stored vehicle model to determine the vehicle velocity used in the tire model. To do so, the vehicle resistance force or drag which depends on the vehicle velocity is preferably calculated in the vehicle model, and the forces transferred from the wheels in question to the roadway surface are subtracted from the value of the vehicle resistance force. Then the vehicle velocity value is determined from the resulting difference and the mass of the vehicle.

The tire normal force can be determined for each tire as a function of the driving situation using the vehicle model which takes the vehicle dynamics into account. Thus, it is possible to simulate the slip for each tire without having to know or estimate the torque distribution in advance. Instead, a realistic torque distribution is established automatically by this type of slip simulation according to the present invention.

One particular advantage of the method according to the present invention consists of the fact that the tire model makes it possible to simulate the dependence of the properties of the slipping wheel not only on the load and angular wheel speed as well as the vehicle velocity but also on the side slip angle of the tire or wheel. The side slip angle is the angle between the longitudinal wheel axis and the vector of the wheel velocity(page 34, of the above mentioned publication by M. Würtenberger of 1997). Thus, in this refinement of the method according to the present invention, the vehicle speed is entered as a vector into the tire model, which also determines a transverse or lateral force of the tire in addition to a longitudinal or peripheral force of the tire. The resulting force vector is fed back into the vehicle model which determines the translational speed vector of the wheel taking this force vector into account. In this way, transverse or lateral forces acting on the vehicle and each individual tire can be taken into account.

The steering angle is also used in the vehicle model to take the lateral forces into account. The side slip angle established for each wheel is then determined in the vehicle model from the steering angle and the resulting angle of steering at the wheel, respectively, and this value of the side slip angle is entered into the tire model.

It is also advantageous to determine the rolling resistance force for each tire as a function of the tire normal force and the angular wheel speed in the tire model and to take into account said rolling resistance force when determining the force transferred by the respective tire to the road surface. In the past, a torque corresponding to the rolling resistance has been determined from the vehicle speed and has been taken into account in a total moment of resistance of the vehicle.

For the tire model preferably the following parameters are stored: model constants for the relationship between the slip and the coefficient of friction, the tire radius, a tire characteristics map for the longitudinal force transferred from the tire to the road surface and for the tire restoring moment or self aligning torque and preferably also a tire characteristics map for the lateral force transferred from the tire to the road surface.

In addition to the setpoint torque and the force applied by the tire to the road surface, the tire model can also provide, in case of need, the slip value and the dynamic wheel radius rdyn which varies as a function of the forces acting on the tire (due to the normal force, the air pressure, the rotational speed, etc.).

Braking moment and king pin angle can be entered in the computer to be taken into account in the tire model and vehicle model.

It is thus possible with the method according to the present invention not only to analyze various drive systems but also to take into account a wide variety of different roadway surfaces and conditions in varying driving situations. In addition, route profiles may also be included regardless of the test object and the condition of the road. Thus, for example, route information obtained with GPS (global positioning system) can also be entered into the simulation computer and combined with any desired vehicle and tire data which is also entered. Thus, different combinations of test objects and routes can be simulated on the test bed or test stand. This offers an important advantage in comparison with the previous practice of driving a route with actual vehicles and recording load collectives and then simulating or reproducing these load collectives on a test bed. In this way, it is possible to test objects according to the present invention despite the fact that no vehicle yet exists and no load collectives have been recorded. The road surface properties (e.g. dry or wet surfaces) can also be modified as desired in the simulation.

Furthermore, the method according to the present invention makes it possible to take each individual tire into account separately with regard to tire normal force and rolling resistance.

If desired, the vehicle model can provide the side slip angle of the vehicle.

Figure 2:
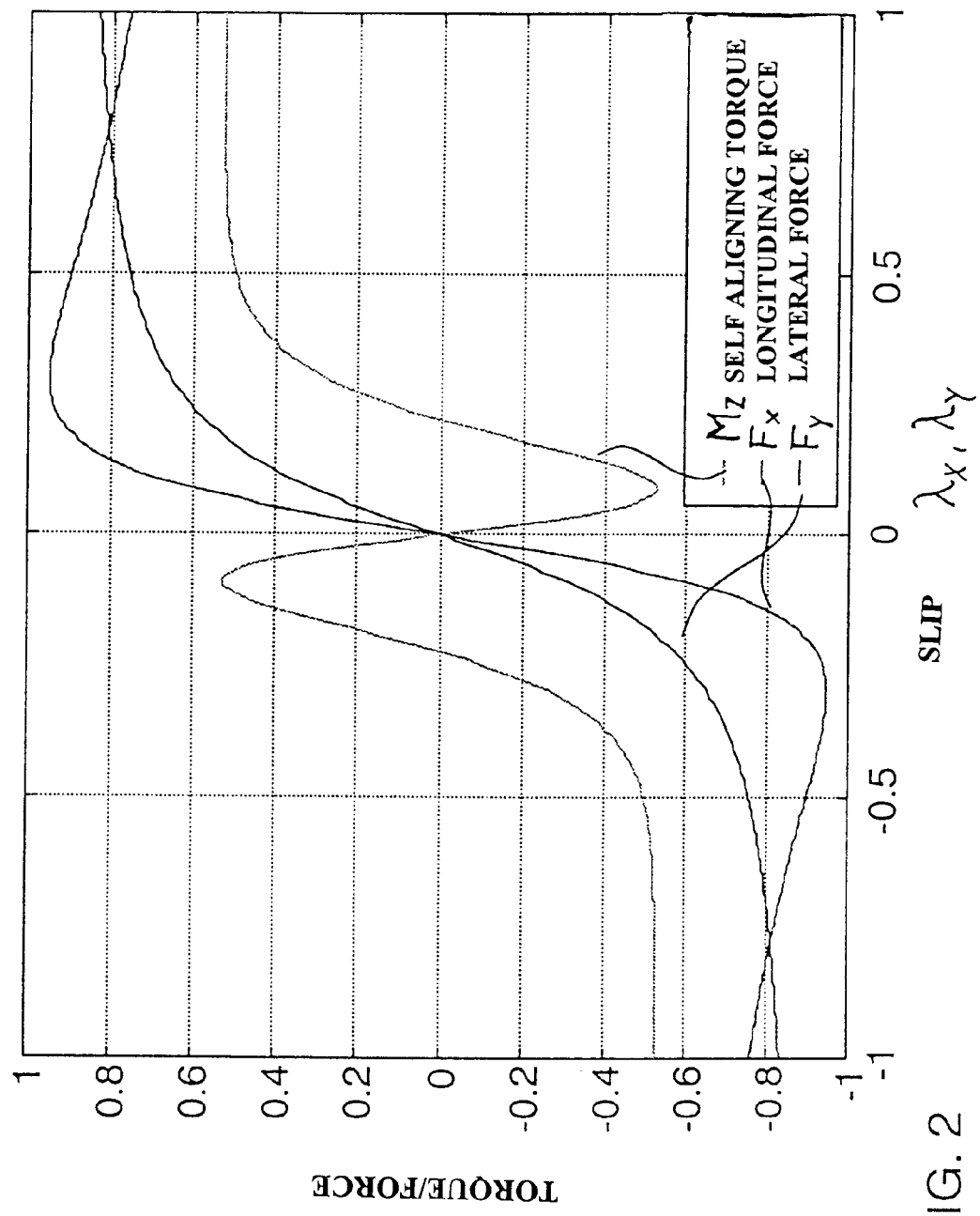
Figure 3:
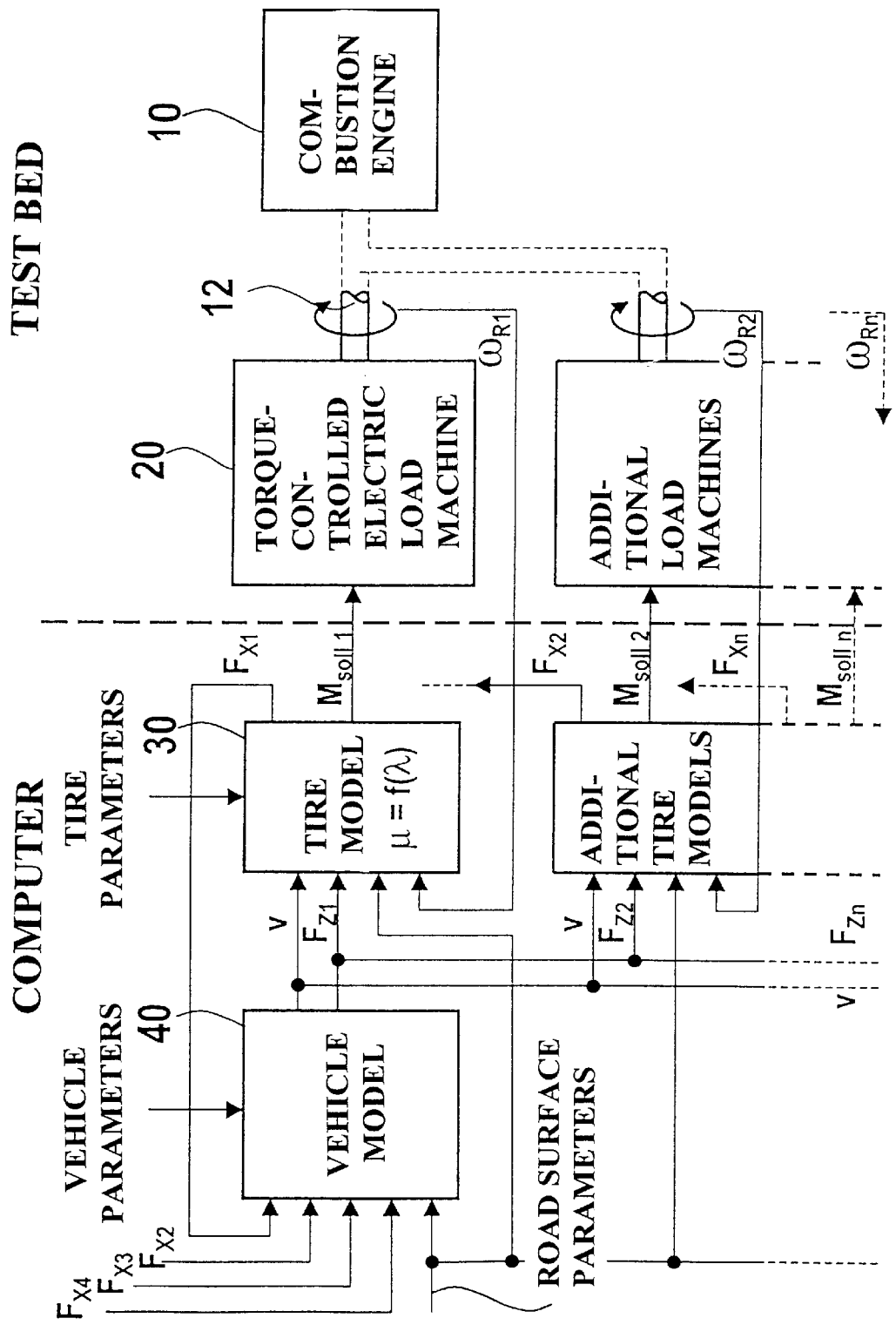

The present invention is explained in greater detail on the basis of the drawings, which show:

FIG. 1 a schematic diagram of a tire rolling on a section of roadway,

FIG. 2 measured steady-state characteristic maps for longitudinal force, lateral force and self aligning torque as a function of the slip of a tire, and FIG. 3 a block diagram illustrating the method according to the present invention.

FIG. 1 shows the simpler case where only a longitudinal force $F_x$ is applied to the road surface by the tire but no lateral force is applied. It is known that a slip occurs in the form of a relative motion between the tire and the roadway surface due to the rubber friction of the tire on the roadway surface. The wheel contact or normal force $F_z$ and the longitudinal force $F_x$ are linked through the coefficient of friction $\mu$. However, this value is not constant, but instead depends on the slip. This dependence on the slip $\lambda$ is simulated according to the present invention by using one of the tire models described above. In a preferred embodiment the so-called "Erweiterte Pacejka-Modell" [expanded model of Pacejka] was used.

In addition to the curves of the longitudinal or peripheral force $F_x$ as the output quantity of a static tire model, FIG. 2 also shows the lateral or transverse force $F_y$ and the self aligning torque as a function of the slip $\lambda$. The curves shown are plotted under the assumption of longitudinal motion only (zero lateral force) or lateral motion only (zero longitudinal force). The values plotted were recorded on a drum test bed for a commercially available tire for a passenger vehicle at a constant tire normal force (also wheel load) and a king pin angle of zero as well as a constant speed. The slip calculated from the vehicle quantities as an input quantity of the tire model represents a vector quantity with a slip component $\lambda_x$ in the longitudinal direction of the wheel and with a slip component $\lambda_y$ in the transverse direction of the wheel.

For simplicity sake, FIG. 3 does not take any lateral or transverse forces into account. The function blocks of the simulation computer are shown at the left of the dotted line in the block diagram in FIG. 3, and the elements of the test bed are shown at the right of the line. This schematic diagram represents a drive shaft of a power train test bed, with the others being merely indicated. A combustion engine 10 acts on this drive shaft. A torque-controlled electric load machine 20 is mounted in a known manner on the shaft 12 driven by the engine 10. The inertia of this machine preferably corresponds approximately to that of one wheel, so that the rotational motion of the wheel is dynamically modeled realistically by means of this machine and need not be simulated. The load machine 20 and its torque control (not shown) are designed so that the machine torque delivered is brought as quickly as possible to the respective torque setpoint determined by the simulation computer.

The angular wheel speed (or rpm) of the drive shaft 12, representing the initial angular wheel speed of the load machine 20 and the wheel simulated by it, is measured by a wheel speed sensor (not shown) with high time resolution for practically all rotational positions defined by angle and phase. This value is then sent as the angular velocity $\omega_{R1}$ of the wheel to the simulation computer and entered into the tire model 30 stored therein. Furthermore, the tire parameters characterizing a given type of tire also enter into the tire model. These tire parameters may be stored in the computer in the form of constants for the respective coefficient of friction-slip curve and/or in the form of tire characteristic maps as mentioned above. The roadway parameters, preferably depending on the given route, represent another input variable into the tire model 30. From a vehicle model 40 which takes the vehicle dynamics into account, the vehicle velocity v and the tire normal force $F_{z1}$ are used in the tire model 30. The tire model supplies as output quantities the torque setpoint $M_{Soll1}$ and the longitudinal force $F_{x1}$ transferred from the tire to the road surface. The longitudinal force $F_{x1}$, like the longitudinal forces of the other wheels taken into account, is fed back to the vehicle model 40 for calculation of the vehicle velocity v. In a preferred embodiment, the vehicle velocity v is calculated by integrating the difference between the sum of the fed back longitudinal forces $F_{xi}$ and a vehicle resistance force with an integration time constant corresponding to the mass of the vehicle. The vehicle or driving resistance force takes into account, for example, the slope of the road surface, the vehicle air resistance and a rolling resistance which is proportional to the vehicle velocity. However, the latter can also be taken into account in the tire model, as already explained above.

In a preferred embodiment a 2-dimensional plane motion with degrees of freedom in longitudinal and lateral movement as well as rotational movement around the vertical axis was adopted as the vehicle model.

When the lateral force component described above and the resulting slip component $\lambda_y$ in the transverse direction of the tire are taken into account, the lateral force, the longitudinal force and the self aligning torque in the tire model are preferably derived from three-dimensional characteristic maps in which these variables are linked for simulation of the dynamic tire performance. These maps are delivered by the manufacturers of the tires to be simulated. In first implementations of the invention the following tires with corresponding maps have been simulated: 225/40 ZR 18 Conti CSC and 265/35 ZR 18 Conti CSC (produced by Continental).

Examples of such characteristic maps and the corresponding equations linking the parameters can be found in the above-mentioned publication by M. Würtenberger. Then the longitudinal force $F_x$ and the lateral force $F_y$ as well as the self aligning torque are obtained as output quantities of the tire model that are fed back into the vehicle model. The coefficients of friction $\mu_x$ and $\mu_y$ are terms in which both slip components $\lambda_y$ and $\lambda_x$ occur. Therefore, the lateral force $F_y$ is reflected in the torque setpoint calculated from $F_x(\mu_x)$ and $r_{dyn}$. The influence of the dynamic tire performance of the tire in question on the other tires in the entire control circuit is taken into account by feeding back both force components $F_x$ and $F_y$ into the vehicle model. This makes it possible to simulate a true four-wheel model. The vehicle model then calculates the vehicle velocity v as a vector, with at least the x and y components being entered in the tire model. The normal force $F_z$ output by the vehicle model for the individual wheels changes as a function of the lateral forces of the tire.

Different tire models can be used for the tires. An entire vehicle is preferably always simulated with the four tire models, even if there is only one drive side, e.g., rear drive, and not all tires are "present."

According to the above publications and the extensive literature cited there, the vehicle model can also be designed to be as realistic as possible, taking into account aerodynamic forces and gravitation forces acting on the vehicle in order to take into account, for example, the slope of the road surface, the head wind, a lateral inclination of the road and the effect of the pitching and rolling behavior on the wheel normal force. The side slip angle can also be taken into account in the vehicle model. The individual coordinate systems can be converted from the external inertial system to the wheel system in the vehicle model. This was done in a preferred embodiment.

The simulation computer and the torque control provided for the load machines operate as a wheel slip simulation control circuit so quickly that the steep increase in the slip-dependent coefficient of friction curve can be simulated as realistically as possible. To this end, the computation frequency of the model and the torque control time are optimized. Stiff coupling is achieved through a high circuit gain, a short dead time, a short sampling time and a high sampling speed of the control circuit. In one implementation the following values have been used: gain of 200 Nm/rads, dead time 0,6 ms, sampling rate 3 kHz. The cycle time for stipulation of a torque setpoint is preferably less than one millisecond. The sampling and analysis times of the control circuit are preferably synchronized with the optimum control times resulting from the design of the electric load machines. Moreover, measures known from automatic control engineering such as sampling elements and dead time elements with a defined lag time, ramps for limiting the maximum rate of change, damping elements and the like are used. The hardware and software components of the control circuit are linked to the test bed by fast data interfaces.

In implementations of the present invention the following hard- and software have been used:

computer: IMMOS Transputer IMST 805 and in an alternative implementation PC Pentium 3, 256 MB RAM, operating system INTIME of Radisys and Windows NT of Microsoft.

load machines: "APA Asynchron Pendel Maschinen" in form of three-phase asynchronous generators designed as dynamometers with pendulum stator, manufactured by Elin, Wien, Austria inclusive vector regulation control system for the torque control of the machines angular speed sensor: ROD 42 manufactured by Heidenhain, Traunreut, Germany test combustion engine inclusive drive train: Z3.2DL 996 C4 of Porsche, Germany data interfaces: RS 422 Transputerlink and in an alternative implementation Firewire (IEEE 1394)

A variety of different, normal and extreme situations have been simulated with the above mentioned Conti tires as simulated tires. The resulting measured moments and angular wheel speed values have been compared to those which would have been obtained under actual driving conditions. The variety of load cycles showed that the inventional method offers an reliable possibility of simulating the performance of a vehicle on a road surface.

What is claimed is:

1. A method of simulating the performance of a vehicle on a road surface on a power train test bed by means of torque-controlled electric load machines mounted on shafts of a power train of the vehicle and by means of a computer forming a feedback control system with a torque-controlled electric load machine mounted on at least one of said shafts for providing a setpoint torque value for said at least one torque-controlled electric load machine, the method comprising the following steps:
   a) storing within said computer
      a tire model providing values of a coefficient of friction as a function of slip of a tire for determining a slip-dependent friction of the tire on the road surface, and
      a vehicle model for calculating a velocity of said vehicle and a normal force at the tire,
   b) measuring an angular wheel speed on said at least one shaft,
   c) determining a force transferred from the tire to the road surface at the measured angular wheel speed using the tire normal force provided by the vehicle model and a slip-dependent friction of the tire provided by the tire model using a value of the coefficient of friction for a slip of the tire occurring between the measured angular wheel speed and a nominal angular wheel speed which corresponds to the calculated vehicle velocity provided by the vehicle model,
   d) determining a setpoint torque value for the torque-controlled load machine mounted on the at least one shaft at said measured angular wheel speed value using the vehicle velocity provided by the vehicle model and the tire normal force and the slip-dependent friction of the tire determined in step c),
   e) feeding back the force transferred from the tire to the road as determined in step c) from the tire model into the vehicle model to be used in the vehicle model for recalculating the vehicle velocity,
   f) reentering the value of the vehicle velocity recalculated in step e) into the tire model, and
   g) repeating steps b) to d) to recalculate the setpoint torque value for the torque-controlled load machine mounted on the at least one shaft.

2. A method according to claim 1 wherein step a) comprises entering parameters of the tire to be simulated and parameters of the road surface into the tire model.

3. A method according to claim 1 comprising calculating, in the vehicle model of the computer, a vehicle resistance force which depends on the vehicle velocity, subtracting the force transferred from the tire to the road surface from the calculated resistance force, and determining the vehicle velocity using the resulting difference value and a mass of the vehicle.

4. A method according to claim 1 comprising calculating, in the vehicle model of the computer, a vehicle resistance force which depends on the vehicle velocity, subtracting the force transferred from the tire to the road surface and forces transmitted to the road surface from any other tire to be simulated from the calculated resistance force, and determining the vehicle velocity using the resulting difference value and a mass of the vehicle.

5. A method according to claim 1 comprising:
   calculating a steering angle of a wheel comprising the tire, said steering angle resulting from a given steering-wheel angle, and
   using a side slip angle of the wheel which results from the above steering-wheel angle in order to calculate a lateral and a longitudinal slip of the tire in the tire model.

6. A method according to claim 5 wherein a lateral force, a longitudinal force and a self aligning torque of the tire are determined taking into account said lateral and said longitudinal slip and are fed back into the vehicle model.

7. A method according to claim 1 comprising taking into account vehicle dynamics when determining the tire normal force in the vehicle model.

8. A method according to claim 1 comprising calculating a rolling resistance force as a function of the tire normal force and the measured angular wheel speed value and using the calculated rolling resistance force when determining the force transferred from the tire to the road surface.

9. A method according to claim 1 wherein step a) comprises entering:
   constants for taking into consideration slip dynamics and related damping,
   a radius of the tire, and
   at least one characteristic map selected from a group consisting of:
      a characteristics map for a longitudinal force transferred to the road surface,
      a characteristics map for a lateral force applied by the tire to the road surface, and
      a characteristics map for a self aligning torque of the tire,
   as tire parameters for the tire model into the computer.

10. A method according to claim 1 comprising entering a king pin angle and a braking moment into the computer to be used in the tire model and the vehicle model.

11. A method according to claim 1 wherein electric load machines each simulating a moment of inertia of a respective wheel are used as said torque-controlled electric load machines.

12. A method according to claim 1 wherein feedback control means are provided for each one of said torque-controlled electric load machines respectively mounted on a shaft of said vehicle.

* * * * *